United States Patent
Quardt et al.

(10) Patent No.: US 7,864,497 B2
(45) Date of Patent: Jan. 4, 2011

(54) PROTECTIVE CIRCUIT

(75) Inventors: Dirk Quardt, Iserlohn (DE); Volker Grosch, Herzkamp (DE); Thomas Grossen, Schwerte (DE); Harald Mundinger, Herscheid (DE)

(73) Assignees: Guenther Spelsberg GmbH & Co. KG, Schalksmuehle (DE); Insta Elektro GmbH, Luedenscheid (DE)

( * ) Notice: Subject to any disclaimer, the term of this patent is extended or adjusted under 35 U.S.C. 154(b) by 548 days.

(21) Appl. No.: 11/814,045

(22) PCT Filed: Jan. 24, 2006

(86) PCT No.: PCT/EP2006/000599

§ 371 (c)(1),
(2), (4) Date: Jul. 16, 2007

(87) PCT Pub. No.: WO2006/079503

PCT Pub. Date: Aug. 3, 2006

(65) Prior Publication Data

US 2009/0195081 A1    Aug. 6, 2009

(30) Foreign Application Priority Data

Jan. 26, 2005   (DE) ................. 10 2005 003 720
Apr. 20, 2005   (DE) ................. 10 2005 018 463
May 15, 2005   (DE) ................. 10 2005 012 213

(51) Int. Cl.
*H01L 31/042*    (2006.01)

(52) U.S. Cl. ........................... 361/92; 136/244

(58) Field of Classification Search ............ 361/92; 136/244; 320/136
See application file for complete search history.

(56) References Cited

U.S. PATENT DOCUMENTS

| | | | | |
|---|---|---|---|---|
| 3,600,599 A | * | 8/1971 | Wright et al. | 307/53 |
| 5,367,310 A | * | 11/1994 | Warnagiris | 343/745 |
| 6,225,793 B1 | | 5/2001 | Dickmann | |
| 6,246,219 B1 | * | 6/2001 | Lynch et al. | 323/223 |
| 7,612,283 B2 | * | 11/2009 | Toyomura et al. | 136/244 |
| 2005/0172995 A1 | | 8/2005 | Rohrig et al. | |

FOREIGN PATENT DOCUMENTS

| | | |
|---|---|---|
| DE | 199 04 561 C1 | 8/2000 |
| JP | 8-172209 A | 7/1996 |
| JP | 2000-174308 * | 6/2000 |

* cited by examiner

*Primary Examiner*—Danny Nguyen
(74) *Attorney, Agent, or Firm*—Roberts Mlotkowski Safran & Cole, P.C.; David S. Safran

(57) ABSTRACT

A protective circuit for electrical connection to solar cells of a solar cell module is provided with a protective circuit that has a controlled electronic circuit arrangement. In this way, only minimal heating of the protective circuit for electrical connection of solar cells of a solar cell module occurs in operation. The controlled electronic circuit arrangement can have a trigger circuit and a switching arrangement which can be triggered by the trigger circuit, the switching arrangement being connected parallel to at least one solar cell, and in the case of shading of the solar cells, is at least temporarily activated by the trigger circuit so that a current bypass for the shaded solar cell is achieved.

11 Claims, 6 Drawing Sheets

PROTECTIVE CIRCUIT

BACKGROUND OF THE INVENTION

1. Field of the Invention

The invention relates to a protective circuit for electrical connection to solar cells of a solar cell module, with a protective means which, in the case of a shaded solar cell, acts as a current bypass for the shaded solar cell.

2. Description of Related Art

Protective circuits for electrical connection to solar cells of a solar cell module are well known from practice in diverse versions. These circuits are also partially called terminal circuits for solar cells.

Generally, several solar cells are interconnected into solar cell modules. In this regard, there is either the possibility of series connection or the possibility of parallel connection of the solar cells in the solar cell module. By parallel connection of the solar cells, the individual currents of the solar cells are added to one another to form a total current. In this connection, the solar cells connected in parallel should have essentially the same physical properties so that, in practice, parallel connection of solar cells has not prevailed, especially also since the individual solar cells can already deliver a current of a few amperes and the output voltage of individual solar cells is typically too small to be able to operate electrical devices, such as household appliances.

Therefore, when solar cell modules are assembled from individual solar cells, they are often series-connected. However, a problem can arise when a solar cell module is partially shaded in operation, so that one solar cell or a majority of solar cells of the solar cell module acquires less solar radiation or none at all, thereby affecting power output from the module. The reason for the solar irradiation being reduced in this way can be fouling of the solar cells and/or casting of shadows by trees, building facilities or building themselves.

In contrast to shading of the solar cell module uniformly over the entire area, which leads only to a power reduction overall, the following problem arises with partial shading: A common current flows through the series-connected solar cells of the solar cell module, each individual solar cell with its respective voltage contributing to the overall voltage of the solar cell module. At this point, if a solar cell is shaded, it no longer produces voltage and essentially opposes a diode in the reverse direction to the current flow in the solar cell module. This means that the entire solar cell module can no longer deliver current so that the entire operation of the solar cell module is adversely affected.

Furthermore, there is a voltage on the shaded solar cell which depends on the position of the shaded solar cell in the series circuit. If the voltage which is present on the shaded solar cell is greater than its reverse voltage, a breakdown, and thus, permanent damage will occur in the solar cell.

Even if the solar cell should not be damaged by a breakdown, in a shaded solar cell, a large power loss is converted so that the shaded solar cell heats up. This heating can also lead to damaging of the shaded solar cell and the solar cells adjacent to it.

In order to avoid the problems associated with a partially shaded solar cell, protective means are used, in general, specifically, bypass diodes which are connected anti-parallel to the solar cells. This results in that a shaded solar cell no longer contributes to the total solar cell voltage, but the current flow is nevertheless maintained. The solar cell module shows only a reduced operating voltage, but does not completely fail. Moreover, in the shaded solar cell, power is no longer converted so that damage to the shaded solar cell can be avoided.

Fundamentally, each solar cell of a solar cell module could be assigned exactly one bypass diode. However, often the procedure is such that a plurality of series-connected solar cells, i.e., a so-called string of solar cells, is safeguarded by a common bypass diode.

Protective circuits for electrical connection to solar cells of a solar cell module, generally, have at least one bypass diode, often a plurality of bypass diodes. However, this is associated with the problem that the protective circuits used for electrical connection of solar cells of a solar cell module are greatly heated by the power converted into the bypass diodes; this is disadvantageous in various respects.

SUMMARY OF THE INVENTION

Therefore, a primary object of the present invention is to devise a protective circuit for electrical connection to the solar cells of a solar cell module which will heat up only slightly in operation.

Proceeding from the initially described protective circuit, the above described object is achieved by the protective circuit having a controlled electronic circuit arrangement as a protective means. Therefore, in accordance with the invention, it is provided that, to prevent the above described problem which is associated with partially shaded solar cells, the protective means is a controlled electronic circuit arrangement so that the use of bypass diodes can be reduced or entirely avoided. By replacing bypass diodes with a controlled electronic circuit arrangement which is functionally essentially identical to the bypass diodes, the heating of the circuit arrangement can be reduced, as described below.

The identical functional effect to the bypass diodes known from the prior art can be achieved in different ways. According to one preferred development of the invention, it is provided that the controlled electronic circuit arrangement has a trigger circuit and a switching means which can be triggered by the trigger circuit, the switching means being connected parallel to at least one solar cell, preferably parallel to a string of solar cells, and in the case of shading of one of the solar cells to which it is connected in parallel, it is at least temporarily activated by the trigger circuit so that current bypass for the shaded solar cell is achieved.

The corresponding switching means can be implemented in different ways. However, according to one preferred development of the invention, it is provided that the switching means has two series-connected electrical or electronic switching devices which are triggered by the trigger circuit. According to one preferred development of the invention, it is provided, in particular, that the switching devices are two oppositely polarized transistors, preferably two MOSFETs. Furthermore, it applies that, according to one preferred embodiment of the invention, it is provided that the power is supplied to the trigger circuit via the current which has been produced by the unshaded solar cells of the solar cell module, and according to one preferred development of this embodiment of the invention, its being especially provided that the trigger circuit is provided with a storage capacitor.

According to another preferred embodiment, it is alternatively provided that the protective means is a controlled electronic circuit which, for at least one string of solar cells, has at least one transistor and at least one DC/DC converter which is switched parallel to the latter and which is connected to the trigger circuit via an energy storage device. In this execution, it is especially advantageous that the protective means has economical MOSFETs with a small space requirement because from the low forward voltage of the parasitic diode of the MOSFET, the voltage necessary to trigger it is produced using a voltage converter.

Furthermore, it is especially advantageous if voltage conversion takes place by integration of a protective means into at least two strings of solar cells of a solar cell module. On the one hand, it is possible such that the protective means is adequately supplied in alternation from the voltage present over one MOSFET, because there are several MOSFETs. On the other hand, when all the solar cells belonging to a string are shaded, a sufficient voltage can be obtained from the total of the forward voltages of the parasitic diodes of the MOSFETS in order to use this voltage for conversion and triggering of the MOSFETs. Moreover, it is advantageous that the maximum voltage occurring in the backward direction per protective means is limited to the forward voltage of a silicon diode; this minimizes the risk of complete failure of supply when there is insufficient illumination of the solar cells that are remaining in operation, for example, due to diffuse light.

Finally, for all the aforementioned configurations of protective circuits for solar cells of a solar cell module according to one preferred development of the invention, it is provided that an overvoltage protection element is used for protecting the protective circuit and the solar cells from overvoltages, for example, by an adjacent lightning strike.

In particular, there are numerous possibilities for embodying and developing the protective circuits in accordance with the invention. For this purpose reference is made to the following detailed description of preferred embodiments of the invention in conjunction with the accompanying drawings.

DETAILED DESCRIPTION OF THE INVENTION

Figure 1:
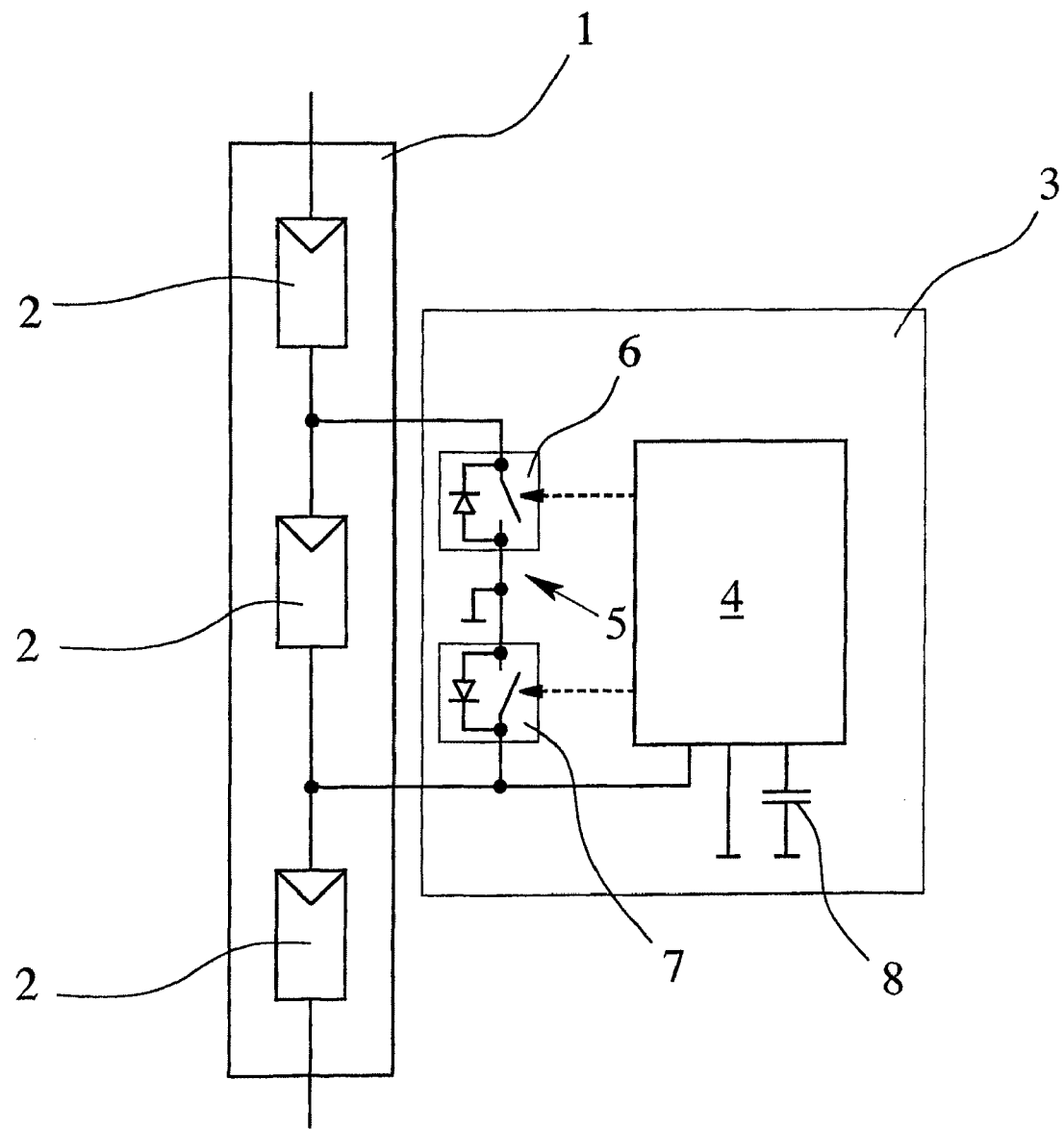
FIG. 1 schematically shows a protective circuit according to a first preferred embodiment of the invention.

FIG. 1 shows a solar cell module 1 which has a plurality of series-connected solar cell strings 2 which, for their part, are comprised of several, likewise, series-connected solar cells which are not shown individually. The provision of three strings 2 for the solar cell module 1 is used purely an example. Likewise, safeguarding via a protective circuit according to one preferred embodiment of the invention is shown, by way of example, for only one of the strings 2. There can, of course, corresponding safeguarding can be provided for each string 2.

As already mentioned, the objective is to devise a protective circuit which ensures that, in the case of shading of the string which is being safeguarded, current bypass for this shaded string is achieved, so that the solar cell module 1, on the one hand, continues to be ready for operation, i.e., delivers a current, and on the other hand, damage of the shaded string 2 is prevented. On this purpose, the protective circuit has a controlled electronic circuit arrangement 3 which has a trigger circuit 4 and a switching means 5.

The switching means 5 is formed by two switching devices, i.e., by two oppositely polarized MOSFETs 6, 7, which can be triggered by the trigger circuit 4. Otherwise, the trigger circuit 4 is also provided with a storage capacitor 8 so that, in the case of shading of the string 2 which is safeguarded by the protective circuit, the following sequence is enabled:

When the safeguarded string 2 is shaded and the remaining string(s) 2 of the solar cell module 1 continues to be illuminated, a voltage builds up via the lower blocking MOSFET 7 as a result of the parasitic diode of the upper MOSFET 2. The trigger circuit 4 is now designed such that it limits this voltage to roughly 20 V by partially activating at least the MOSFET 7 so that damage of the safeguarded string 2 is avoided. In this phase, the storage capacitor 8 is charged in a current-limited manner from the voltage via the MOSFET 7. As soon as the storage capacitor 8 is charged to roughly 15 V, the MOSFETs 6, 7 are completely activated, by which the voltage prevailing over the MOSFETs 6, 7 collapses. Only a few microseconds pass from the occurrence of the initial reverse voltage to this instant of collapse of the voltage.

The inherent power consumption of the trigger circuit 4 slowly reduces the voltage over the storage capacitor 8 and on the gates of the MOSFETs 6, 7. As soon as a voltage is not reached at which complete activation of the MOSFETs 6, 7 is no longer ensured, the trigger circuit 4 switches off at least the MOSFET 7. Then, a voltage builds up over the MOSFET 7 and in turn is limited, as described above. The conductive phase of the MOSFETs 6, 7 lasts several dozen milliseconds. Based on the voltage-limited blocking phase, which is very short compared to the conductive phase, the instantaneously high power losses over the MOSFETs 6, 7 during the blocking phases thus hardly matter as compared to the conduction losses, so that altogether losses distinctly less than those of a Schottky diode are achieved.

The trigger circuit 4 is also designed such that it is not supplied when the string 2 it is safeguarding is illuminated, so that the MOSFETs 6, 7 block. Besides the low reverse currents of the MOSFETs 6, 7, no losses at all occur by the controlled electronic circuit arrangement 3 so that the total losses in practice are even below those of Schottky diodes. Moreover, in the protective circuit described here according to one preferred embodiment of the invention, it is important that the controlled electrical circuit arrangement in the voltage-limited blocking phase is supplied from the remaining, therefore still illuminated, strings 2 so that outside supply is not necessary.

To enable the aforementioned functionality, the trigger circuit 4 has essentially one Schmitt trigger which is supplied by the drain of the MOSFET 7. This Schmitt trigger provides for the MOSFETs 6, 7 to be activated only when there is a voltage on the capacitor 8. The mark-to-space ratio results from the hysteresis of the Schmitt trigger and the inherent power consumption of the circuit arrangement 3 in conjunction with the capacitance of the capacitor 8.

The trigger circuit 4 can be implemented especially easily, for example, with a voltage supervisor IC, such as the MAX6462 from Maxim Integrated Products. When using such a voltage supervisor IC, only a simple additional protective circuit is necessary which has a diode which protects the circuit against the regular polarized operating voltage with the string illuminated, and a resistor which limits the current through this diode as long as the MOSFETs are not yet enabled. The diode in conjunction with the resistor at the output of the trigger circuit 4 limits the voltage via the MOSFETs 6, 7, while the voltage only builds up via the capacitor 8.

Figure 2:
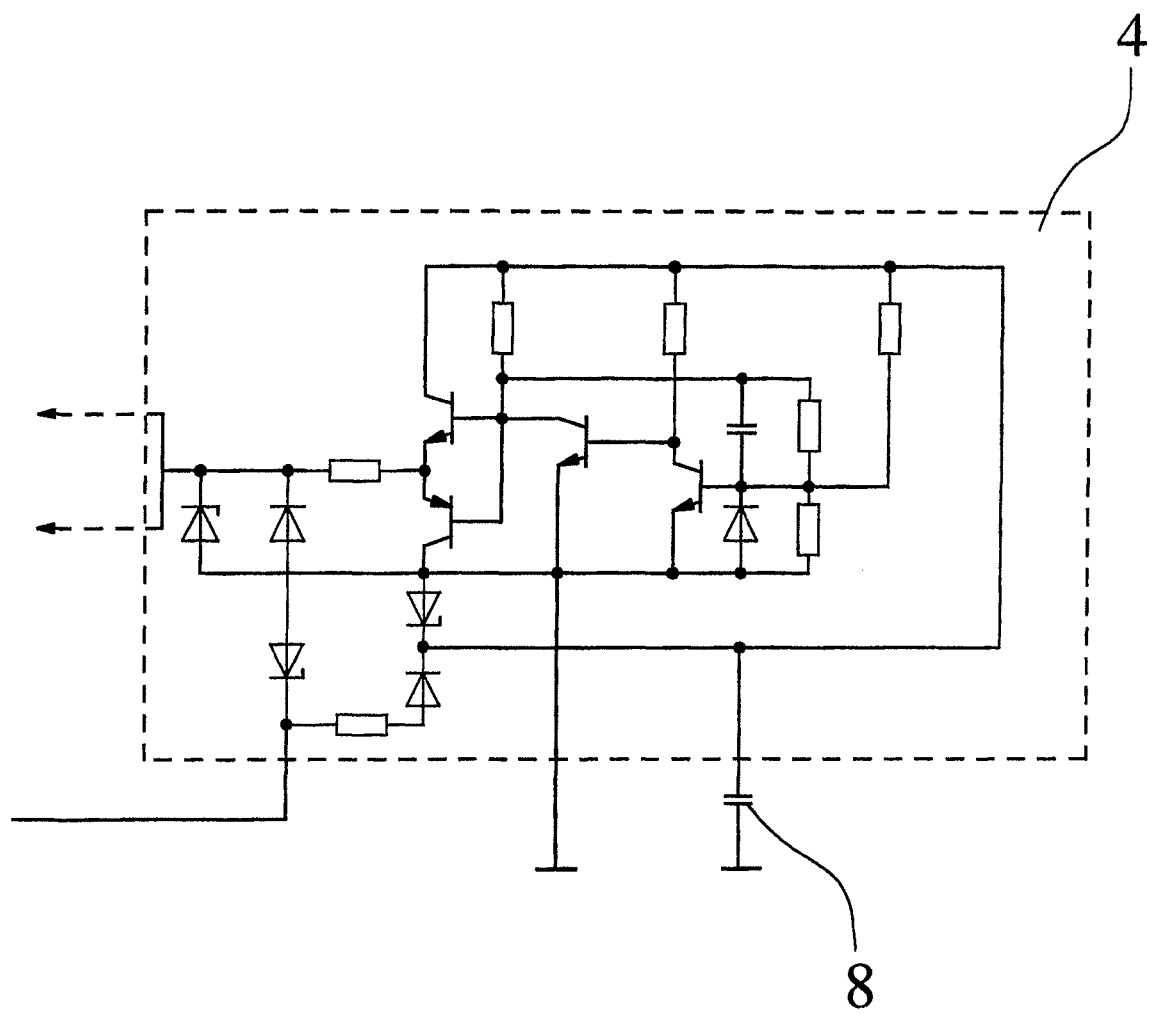
FIG. 2 shows the structure of the trigger circuit of the FIG. 1 protective circuit, FIG. 3 schematically shows a protective circuit according to a second preferred embodiment, FIG. 4 schematically shows a protective circuit according to a third preferred embodiment.

Thus, the trigger circuit 4, overall, constitutes essentially a comparator circuit which, in particular, can also be built in the manner shown in FIG. 2. This circuit constitutes essentially a discrete equivalent circuit of the aforementioned voltage supervisor IC with the additional protective circuit likewise addressed above.

A second and a third preferred embodiment of the invention which have one and two DC/DC converters are described below.

As follows from FIGS. 3 & 4, a solar cell module conventionally has several series-connected strings A, B, . . . X, to which a circuit arrangement 100 is assigned at least as a protective means. Here, only the strings A, B are shown explicitly, while string X is indicated only with dots and is intended to describe that fundamentally any number of strings can be series connected. Each string A-X is comprised of series-connected solar cells 1-n.

As follows especially from FIG. 3, according to the second preferred embodiment of the invention, the circuit arrangement for each string A-X as a protective means has a MOSFET 10 and a DC/DC converter 20 which is connected via an energy storage device 30 to a trigger circuit 40. The MOSFET 10, as already described, is located parallel to a string A-X and is connected via its gate to a trigger circuit 40. All strings A-X are combined into a solar cell module and assigned to a converter UM.

As follows especially from FIG. 4, according to the third preferred embodiment of the invention, two of the strings A-X, specifically the two strings A and B and C and D are jointly assigned to one protective means. Each solar cell row A and B and C and D has a MOSFET 10 connected in parallel. The two MOSFETs 10 are each connected to a common trigger circuit 40 via their gate, supply of the trigger circuit 40 taking place by the two DC/DC converters 20 which are assigned to a respective string A-X and which are connected in parallel to the series connection of the string A-X, an energy storage device 30 being assigned to one of the DC/DC converters 20. On the one hand, it is possible such that the common protective means for two of the strings A-X is adequately supplied in alternation from the voltage which is present over one MOSFET 10 because there are two MOSFETs 10 per protective means. On the other hand, when all the strings belonging to the protective means are shaded, a sufficient voltage can be obtained from the sum of forward voltages of the parasitic diodes of the MOSFETs 10 in order to use this voltage for conversion and triggering of the MOSFETs 10. All strings A-X are combined here into one solar cell module and assigned to a converter UM.

Figure 3:
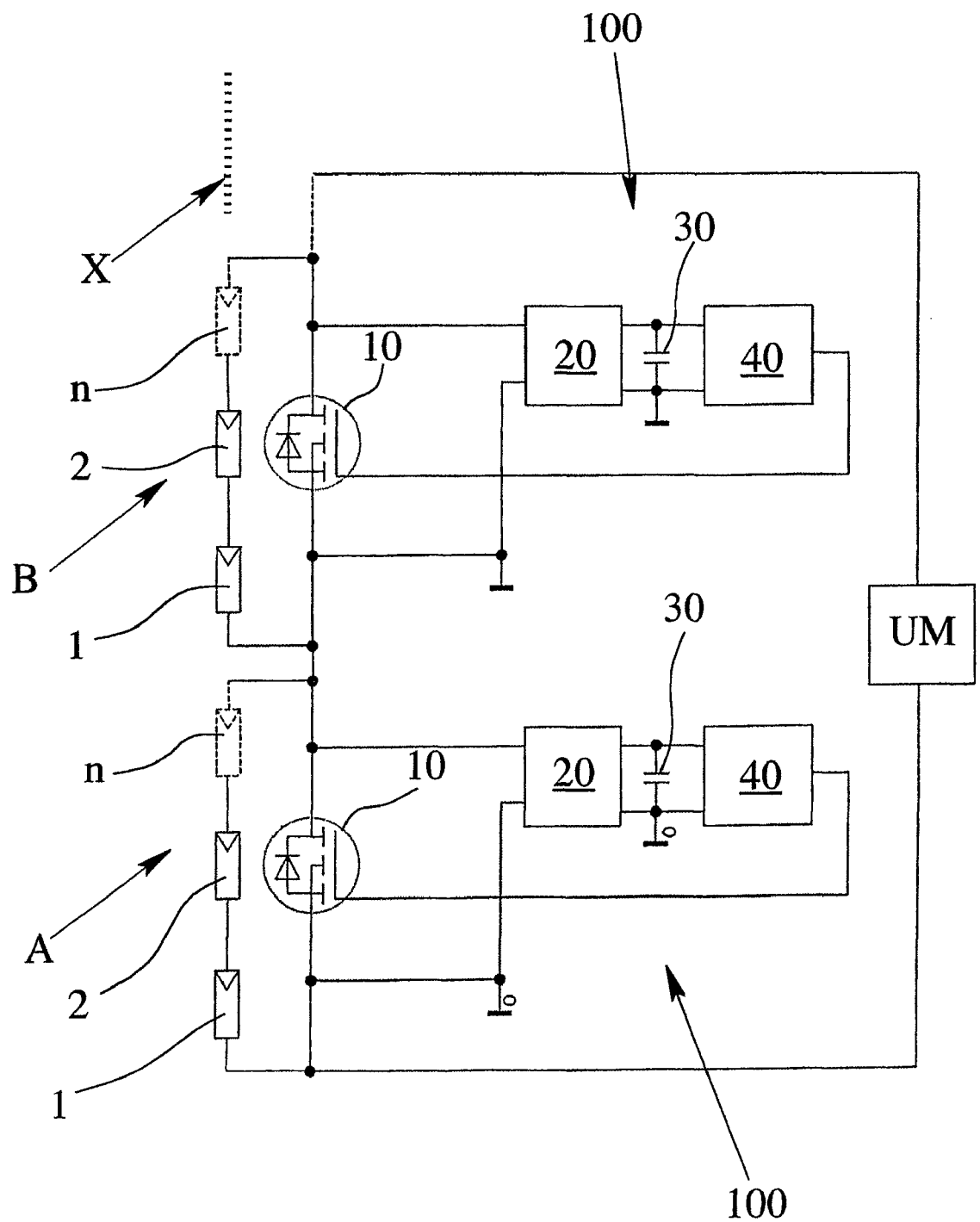
Figure 4:
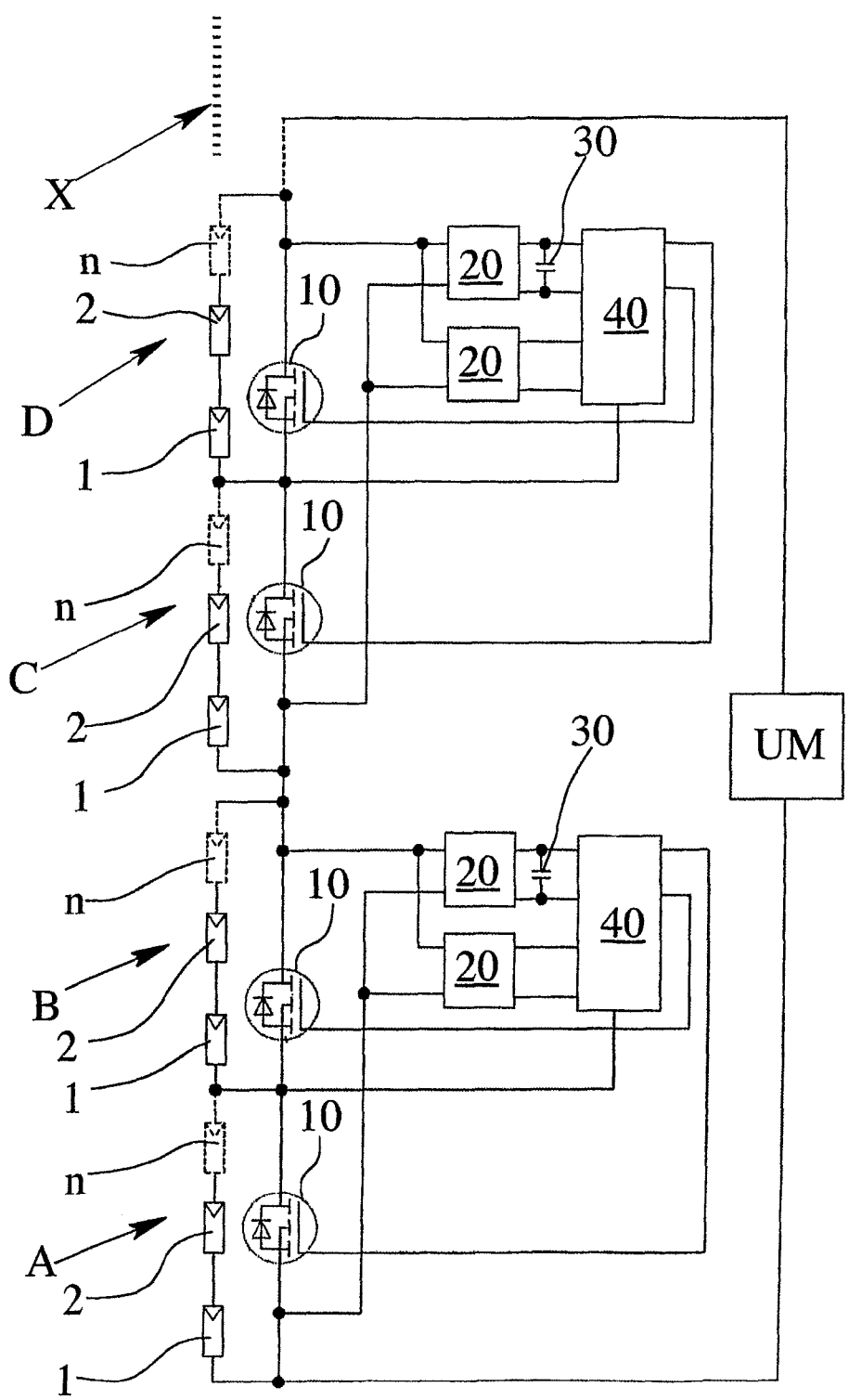
Figure 5:
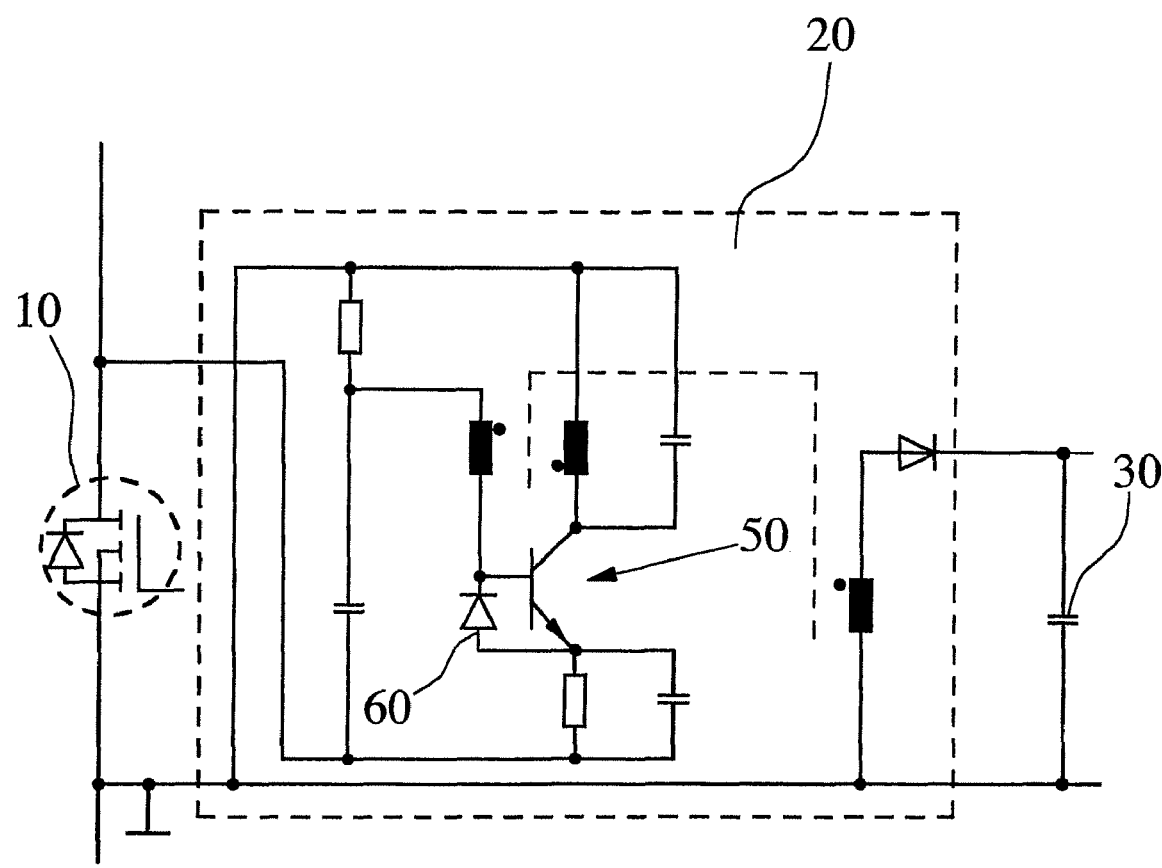
FIG. 5 shows a DC/DC converter of the protective circuits of the embodiments of FIGS. 3 & 4.

FIG. 5 shows how the DC/DC converter 20 from FIG. 3 can be made in particular. The DC/DC converter 20 which converts the voltage, which is formed via the internal diodes of the MOSFETs 10 when a string A-X is shaded, into a voltage which is suitable for triggering the MOSFETs 10, will work with input voltages less than 0.7 V in order to ensure the bypass function. For example, a Meissner oscillator (An electron-tube oscillator in which the grid and plate circuits are inductively coupled through an independent tank circuit which determines the frequency.) built with a germanium transistor 50 can be used for this purpose with a transformer which contains a third winding. With respect to the Meissner oscillator, reference should be made to the textbook of U. Tietze and Ch. Schenk *Semiconductor Circuit Engineering*, 9th edition, p. 461 f. Relatively great triggering for the MOSFET 10 can be tapped via the third winding of the transformer and half-wave rectification by the choice of the transformation ratio. A silicon diode 60 located antiparallel to the base-emitter junction of the transistor 50 is used to protect the transistor 50 against the inverse input voltage present when the string A-X is illuminated.

The trigger circuit 40, in the simplest case, is formed essentially of a Schmitt trigger which, when a certain threshold voltage is exceeded, via the capacitor 30, places this voltage at the gate of the MOSFET 10, and when this threshold voltage is not reached by a value given by hysteresis, discharges the gate. The Schmitt trigger provides for the MOSFET 10 to be activated only when there is a voltage above the threshold voltage of the MOSFET 10 on the capacitor 30. The mark-to-space ratio follows from the hysteresis of the Schmitt trigger and the inherent current consumption of the overall circuit in conjunction with the capacitance of the capacitor 30.

Figure 6:
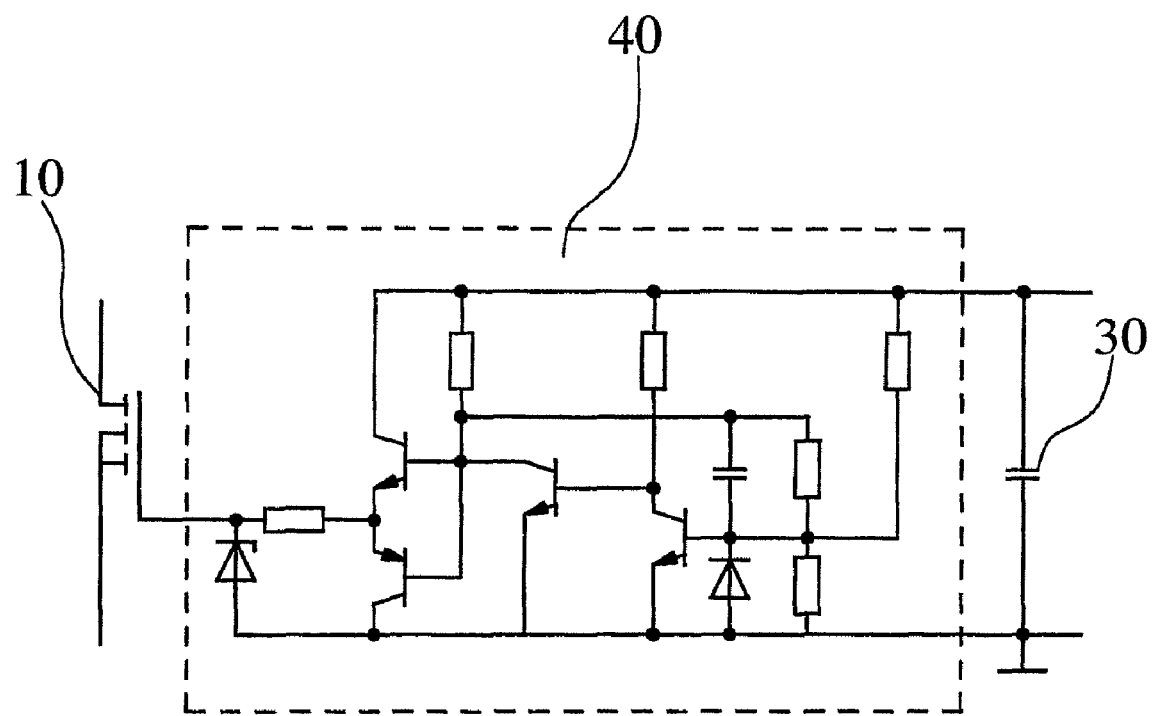
FIG. 6 shows a trigger circuit of the protective circuits of the embodiments of FIGS. 3 & 4.

Similarly to the above described trigger circuit 4 from FIG. 1, in the preferred embodiment of the invention described here, the Schmitt trigger can be implemented especially easily with a voltage supervisor IC, such as the already addressed MAX6462 from Maxim Integrated Products. Otherwise, it applies here and to the above described preferred embodiment of the invention, that suitable Schmitt trigger circuits are achieved especially by use of logic-level MOSFETs. FIG. 6 shows an example of a trigger circuit 40, in particular, how it corresponds in practice to a discrete equivalent circuit of the voltage supervisor IC.

As a result, the invention provides protective circuits for solar cells of a solar cell module which can be used just as easily as a protective circuit with bypass diodes, but which have much lower power losses so that essentially higher currents can be safeguarded.

What is claimed is:

1. A protective circuit for electrical connection of solar cells of a solar cell module, with protective means for providing a current bypass for a shaded solar cell, wherein the protective circuit has a controlled electronic circuit arrangement as the protective means; wherein the protective means comprises at least one transistor and at least one DC/DC converter which is connected parallel thereto and which is connected to a trigger circuit via an energy storage device; wherein the solar cells are arranged in a plurality of series-connected solar cell strings, and wherein a respective protective means is provided for each solar cell string, the protective means each comprising a parallel connected transistor that is connected via a respective gate to the trigger circuit that is assigned to at least two of the solar cell strings.

2. Protective circuit as claimed in claim 1, wherein the controlled electronic circuit arrangement has a switching arrangement which can be triggered by the trigger circuit, the switching arrangement being connected parallel to at least one solar cell, and in the case of shading of the solar cells is at least temporarily activated by the trigger circuit so that said current bypass for the shaded solar cell is achieved.

3. Protective circuit as claimed in claim 2, wherein the switching arrangement has two series-connected electrical or electronic switching devices which are triggered by the trigger circuit.

4. Protective circuit as claimed in claim 3, wherein the switching devices are two oppositely polarized transistors.

5. Protective circuit as claimed in claim 4, wherein the oppositely polarized transistors are MOSFETs.

6. Protective circuit as claimed in claim 2, wherein current produced by unshaded solar cells of the solar cell module supplies power to the trigger circuit.

7. Protective circuit as claimed in claim 2, wherein the trigger circuit comprises a storage capacitor.

8. Protective circuit as claimed in claim 1, wherein a respective DC/DC converter is connected to each trigger circuit for each solar cell string, the DC/DC converter being connected parallel to the series connection of each solar cell string.

9. Protective circuit as claimed in claim 8, wherein an energy storage device is assigned to at least one of the DC/DC converters.

10. Protective circuit as claimed in claim 1, wherein the trigger circuit of the circuit arrangement has a microcontroller.

11. Protective circuit as claimed in claim 3, wherein the trigger circuit of the circuit arrangement has a microcontroller.

* * * * *